(12) United States Patent
Wang

(10) Patent No.: US 6,606,199 B2
(45) Date of Patent: Aug. 12, 2003

(54) GRADED THICKNESS OPTICAL ELEMENT AND METHOD OF MANUFACTURE THEREFOR

(75) Inventor: Tzu-Yu Wang, Maple Grove, MN (US)

(73) Assignee: Honeywell International Inc., Morristown, NJ (US)

( * ) Notice: Subject to any disclaimer, the term of this patent is extended or adjusted under 35 U.S.C. 154(b) by 0 days.

(21) Appl. No.: 09/975,299

(22) Filed: Oct. 10, 2001

(65) Prior Publication Data

US 2003/0067688 A1 Apr. 10, 2003

(51) Int. Cl.$^7$ ............................................. G02B 3/00
(52) U.S. Cl. ....................................... 359/652; 359/653
(58) Field of Search ................................ 359/652, 653; 216/26; 430/321

(56) References Cited

U.S. PATENT DOCUMENTS

| | | | |
|---|---|---|---|
| 3,981,023 A | 9/1976 | King et al. ................... 257/98 |
| 4,317,085 A | 2/1982 | Brunham et al. ............. 372/50 |
| 4,466,694 A | 8/1984 | MacDonald ................. 385/37 |
| 4,660,207 A | 4/1987 | Svilans ....................... 372/45 |
| 4,784,722 A | 11/1988 | Liau et al. .................... 438/34 |
| 4,885,592 A | 12/1989 | Kofol et al. ................. 343/754 |
| 4,901,327 A | 2/1990 | Bradley ........................ 372/45 |
| 4,943,970 A | 7/1990 | Bradley ........................ 372/45 |
| 4,956,844 A | 9/1990 | Goodhue et al. ............. 372/44 |
| 4,971,423 A * | 11/1990 | Nakata et al. ............... 359/413 |
| 5,031,187 A | 7/1991 | Orenstein et al. ............ 372/50 |
| 5,052,016 A | 9/1991 | Mahbobzadeh et al. ...... 372/96 |
| 5,056,098 A | 10/1991 | Anthony et al. .............. 372/45 |
| 5,062,115 A | 10/1991 | Thornton ..................... 372/50 |
| 5,068,869 A | 11/1991 | Wang et al. .................. 372/45 |
| 5,115,442 A | 5/1992 | Lee et al. ..................... 372/45 |
| 5,140,605 A | 8/1992 | Paoli et al. ................... 372/50 |
| 5,158,908 A | 10/1992 | Blonder et al. ............... 372/20 |
| 5,216,263 A | 6/1993 | Paoli ........................... 257/88 |
| 5,216,680 A | 6/1993 | Magnusson et al. .......... 372/20 |
| 5,237,581 A | 8/1993 | Asada et al. .................. 372/45 |
| 5,245,622 A | 9/1993 | Jewell et al. ................. 372/45 |
| 5,258,990 A | 11/1993 | Olbright et al. .............. 372/46 |
| 5,285,466 A | 2/1994 | Tabatabaie ................... 372/50 |
| 5,293,392 A | 3/1994 | Shieh et al. .................. 372/45 |
| 5,315,128 A | 5/1994 | Hunt et al. ................... 257/16 |
| 5,317,170 A | 5/1994 | Paoli ........................... 257/88 |
| 5,317,587 A | 5/1994 | Ackley et al. ................ 372/45 |
| 5,325,386 A | 6/1994 | Jewell et al. ................. 372/50 |

(List continued on next page.)

FOREIGN PATENT DOCUMENTS

JP 5-299779 11/1993

OTHER PUBLICATIONS

Banwell et al., "VCSE Laser Transmitters for Parallel Data Links", *IEEE Journal of Quantum Electronics,* vol. 29, No. 2, Feb. 1993, pp. 635–644.

(List continued on next page.)

*Primary Examiner*—Georgia Epps
*Assistant Examiner*—M. Hasan
(74) *Attorney, Agent, or Firm*—Andrew A. Abeyta

(57) ABSTRACT

A graded optical element is provided that includes graded layers of optical material, wherein the layers may or may not have different indexes of refraction. A method for making such a graded thickness optical element is also provided. A masking layer is preferably spaced above a substrate, where the masking layer has at least one aperture therein. Optical material is then deposited on the substrate through the aperture in the masking layer to form a layer of refr material that extends laterally beyond the aperture in the masking layer in at least one region.

15 Claims, 11 Drawing Sheets

U.S. PATENT DOCUMENTS

| | | | |
|---|---|---|---|
| 5,331,654 A | 7/1994 | Jewell et al. | 372/45 |
| 5,337,074 A | 8/1994 | Thornton | 347/237 |
| 5,349,599 A | 9/1994 | Larkins | 372/50 |
| 5,351,256 A | 9/1994 | Schneider et al. | 372/45 |
| 5,359,447 A | 10/1994 | Hahn et al. | 359/154 |
| 5,359,618 A | 10/1994 | Lebby et al. | 372/45 |
| 5,363,397 A | 11/1994 | Collins et al. | 372/92 |
| 5,373,520 A | 12/1994 | Shoji et al. | 372/45 |
| 5,404,373 A | 4/1995 | Cheng | 372/50 |
| 5,416,044 A | 5/1995 | Chino et al. | 438/39 |
| 5,428,634 A | 6/1995 | Bryan et al. | 372/45 |
| 5,446,754 A | 8/1995 | Jewell et al. | 372/50 |
| 5,475,701 A | 12/1995 | Hibbs-Brenner | 372/50 |
| 5,513,202 A | 4/1996 | Kobayashi et al. | 372/96 |
| 5,530,715 A | 6/1996 | Shieh et al. | 372/96 |
| 5,555,255 A | 9/1996 | Kock et al. | 372/96 |
| 5,557,626 A | 9/1996 | Grodinski et al. | 372/45 |
| 5,561,683 A | 10/1996 | Kwon | 372/96 |
| 5,568,499 A | 10/1996 | Lear | 372/45 |
| 5,598,300 A | 1/1997 | Magnusson et al. | 359/566 |
| 5,606,572 A | 2/1997 | Swirhun et al. | 372/96 |
| 5,642,376 A | 6/1997 | Olbright et al. | 372/99 |
| 5,727,013 A | 3/1998 | Botez et al. | 372/96 |
| 5,728,509 A * | 3/1998 | Eda et al. | 430/321 |
| 5,774,487 A | 6/1998 | Morgan | 372/45 |
| 5,778,018 A | 7/1998 | Yoshikawa et al. | 372/45 |
| 5,818,066 A | 10/1998 | Duboz | 257/21 |
| 5,838,715 A | 11/1998 | Corzine et al. | 372/96 |
| 5,903,590 A | 5/1999 | Hadley et al. | 372/96 |
| 5,940,422 A | 8/1999 | Johnson | 372/45 |
| 5,978,401 A | 11/1999 | Morgan | 372/50 |
| 6,055,262 A | 4/2000 | Cox et al. | 372/96 |
| 6,122,109 A | 9/2000 | Peake et al. | 359/620 |
| 6,154,480 A | 11/2000 | Magnusson et al. | 372/96 |
| 6,365,237 B1 | 4/2002 | Peake et al. | 427/585 |

OTHER PUBLICATIONS

Catchmark et al., "High Temperature CW Operation of Vertical Cavity Top Surface–Emitting Lasers", CLEO 1993, p. 138.

Chemla et al., "Nonlinear Optical Properties of Semiconductor Quantum Wells", *Optical Nonlinearities and Instabilities in Semiconductors,* Academic Press, Inc., Copyright 1988, pp. 83–120.

Choa et al., "High–Speed Modulation of Vertical–Cavity Surface–Emitting Lasers", *IEEE Photonics Technology Letter,* vol. 3, No. 8, Aug. 1991, pp. 697–699.

G. G. Ortiz, et al., "Monolithic Integration of In0.2 GA0.8As Vertical Cavity Surface–Emitting Lasers with Resonance–Enhanced Quantum Well Photodetectors", *Electronics Letters,* vol. 32, No. 13, Jun. 20, 1996, pp. 1205–1207.

Graf, Rudolph, *Modern Dictionary of Electronics,* 6th ed., Indiana: Howard W. Sams & Company, 1984, p. 694.

Jewell et al., "Surface Emitting Microlasers for Photonic Switching & Intership Connections", *Optical Engineering,* vol. 29, No. 3, pp. 210–214, Mar. 1990.

Jewell et al., "Surface–Emitting Microlasers for Photonic Switching and Interchip Connections", *Optical Engineering,* vol. 29, No. 3, Mar. 1990, pp. 210–214.

Kishino et al., "Resonant Cavity–Enhanced (RCE) Photodetectors", *IEEE Journal of Quantum Electronics,* vol. 27, No. 8, pp. 2025–2034.

Kuchibhotla et al., "Low–Voltage High Gain Resonant_Cavity Avalanche Photodiode", *IEEE Photonics Technology Letters,* vol. 3, No. 4, pp. 354–356.

Lai et al., "Design of a Tunable GaAs/AlGaAs Multiple–Quantum–Well Resonant Cavity Photodetector", *IEEE Journal of Quantum Electronics,* vol. 30, No. 1, pp. 108–114.

Lee et al., "Top–Surface Emitting GaAs Four–Quantum–Well Lasers Emitting at 0–85 um", *Electronics Letters,* vol. 24, No. 11, May 24, 1990, pp. 710–711.

Lehman et al., "High Frequency Modulation Characteristics of Hybrid Dielectric/AlGaAs Mirror Singlemode VCSELs", *Electronic Letters,* vol. 31, No. 15, Jul. 20, 1995, pp. 1251–1252.

Miller et al., "Optical Bistability Due to Increasing Absorption", *Optics Letters,* vol. 9, No. 5, May 1984, pp. 162–164.

Morgan et al., "200 C, 96–nm Wavelength Range, Continuous–Wave Lasing from Unbonded GaAs MOVPE–Grown Vertical Cavity Surface–Emitting Lasers", *IEEE Photonics Technology Letters,* vol. 7, No. 5, May 1995, pp. 441–443.

Jiang et al., "High–Frequency Polarization Self–Modulation in Vertical–Cavity Surface–Emitting Lasers", *Appl. Phys. Letters,* vol. 63, No. 26, Dec. 27, 1993, pp. 2545–2547.

Morgan et al., "High–Power Coherently Coupled 8×8 Vertical Cavity Surface Emitting Laser Array", *Appl. Phys Letters,* vol. 61, No. 10, Sep. 7, 1992, pp. 1160–1162.

Morgan et al., "Hybrid Dielectric/AlGaAs Mirror Spatially Filtered Vertical Cavity Top–Surface Emitting Laser", *Appl. Phys. Letters,* vol. 66, No. 10, Mar. 6, 1995, pp. 1157–1159.

Morgan et al., "Novel Hibrid–DBR Single–Mode Controlled GaAs Top–Emitting VCSEL with Record Low Voltage", 2 pages, dated prior to Dec. 29, 2000.

Morgan et al., "Progress and Properties of High–Power Coherent Vertical Cavity Surface Emitting Laser Arrays", *SPIE,* Vo. 1850, Jan. 1993, pp. 100–108.

Morgan et al., "Progress in Planarized Vertical Cavity Surface Emitting Laser Devices and Arrays", *SPIE,* vol. 1562, Jul. 1991, pp. 149–159.

Morgan et al., "Submilliamp, Low–Resistance, Continuous–Wave, Single–Mode GaAs Planar Vertical–Cavity Surface Emitting Lasers", Honeywell Technology Center, Jun. 6, 1995.

Morgan et al., "Transverse Mode Control of Vertical–Cavity Top–Surface Emitting Lasers", *IEEE Photonics Technology Letters,* vol. 4, No. 4, Apr. 1993, pp. 374–377.

Morgan et al., "Vertical Cavity Surface Emitting Laser Arrays: Come of Age,", Invited paper, *SPIE,* vol. 2683–04, OE LASE 96; Photonics West: Frabrication, Testing and Reliablity of Semiconductor Lasers, (SPIE<Bellingham, WA, 1996).

Morgan et al., "Vertical–Cavity Surface–Emitting Laser Arrays" *SPIE,* vol. 2398, Feb. 1995, pp. 65–93.

Morgan, "High–Performance, Producible Vertical Cavity Lasers for Optical Interconnects", *High Speed Electronics and Systems,* vol. 5, No. 4, Dec. 1994, pp. 65–95.

Morgan, "Transverse Mode Control of Vertical–Cavity Top–Surface Emitting Lasers", *IEEE Phot. Tech. Lett.,* vol. 4, No. 4, p. 374, Apr. 1993.

Nugent et al., "Self–Pulsations in Vertical–Cavity Surface–Emitting Lasers", *Electronic Letters,* vol. 31, No. 1, Jan. 5, 1995, pp. 43–44.

U.S. patent application Ser. No. 09/751,422, filed Dec. 29, 2000, entitled "Resonant Reflector for Use with Optoelectronic Devices".

\* cited by examiner

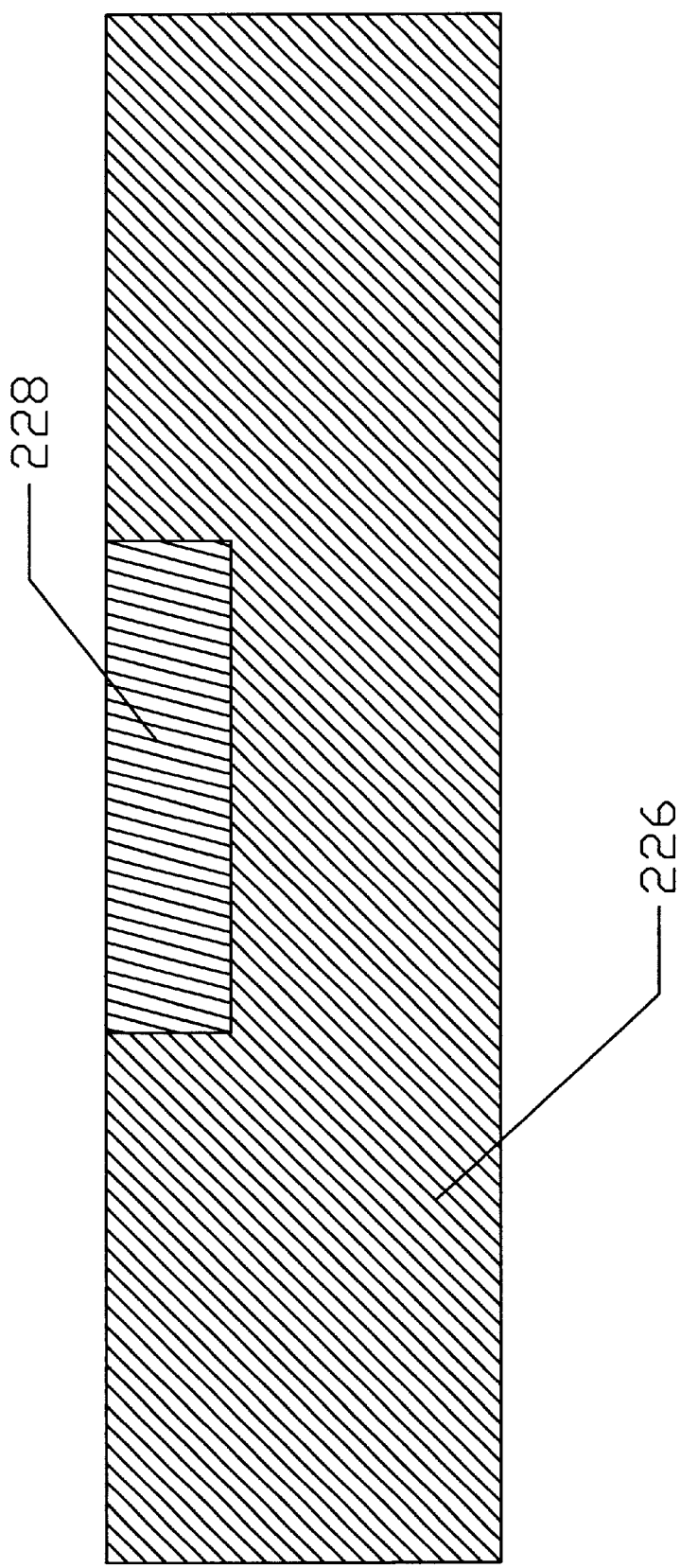

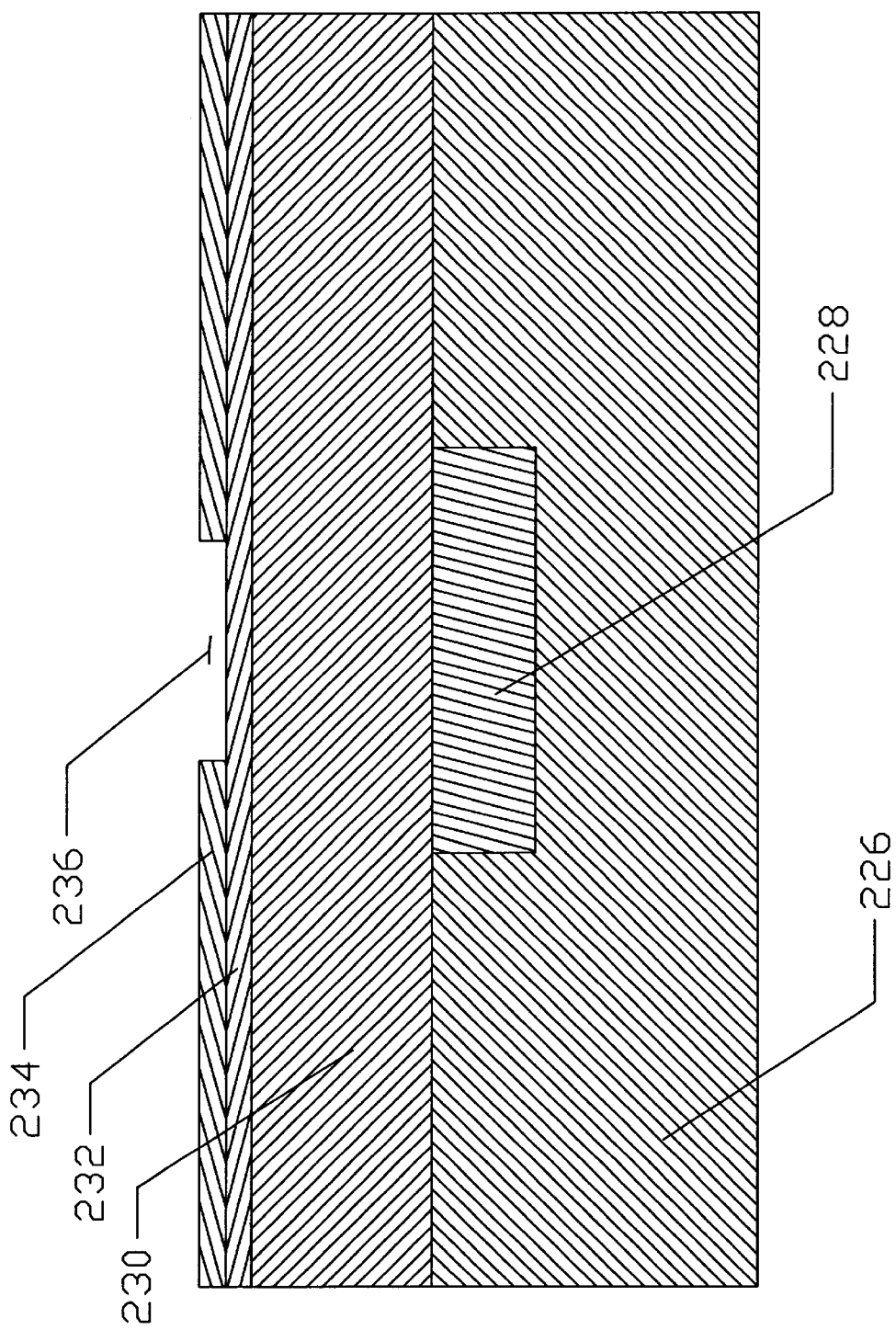

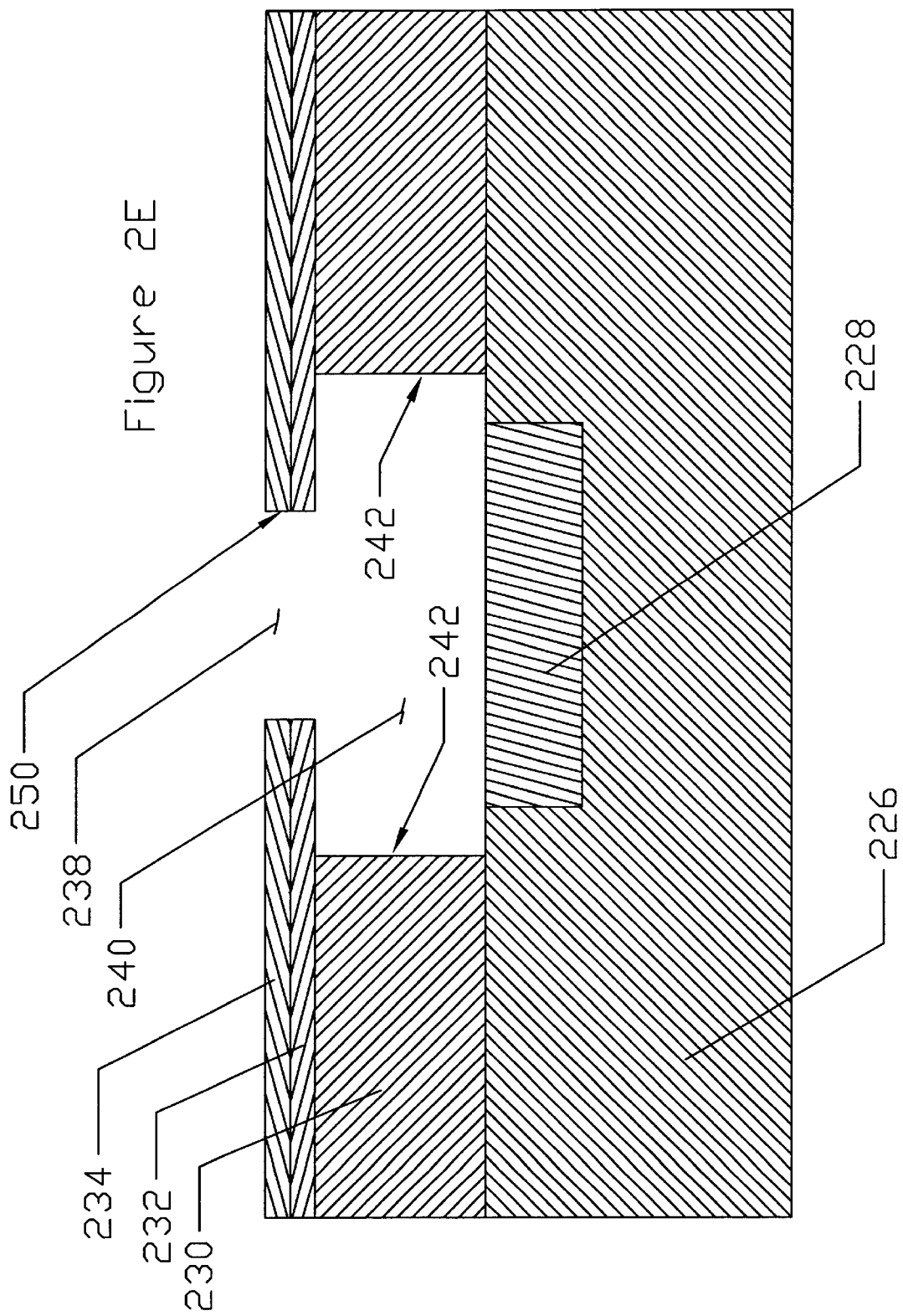

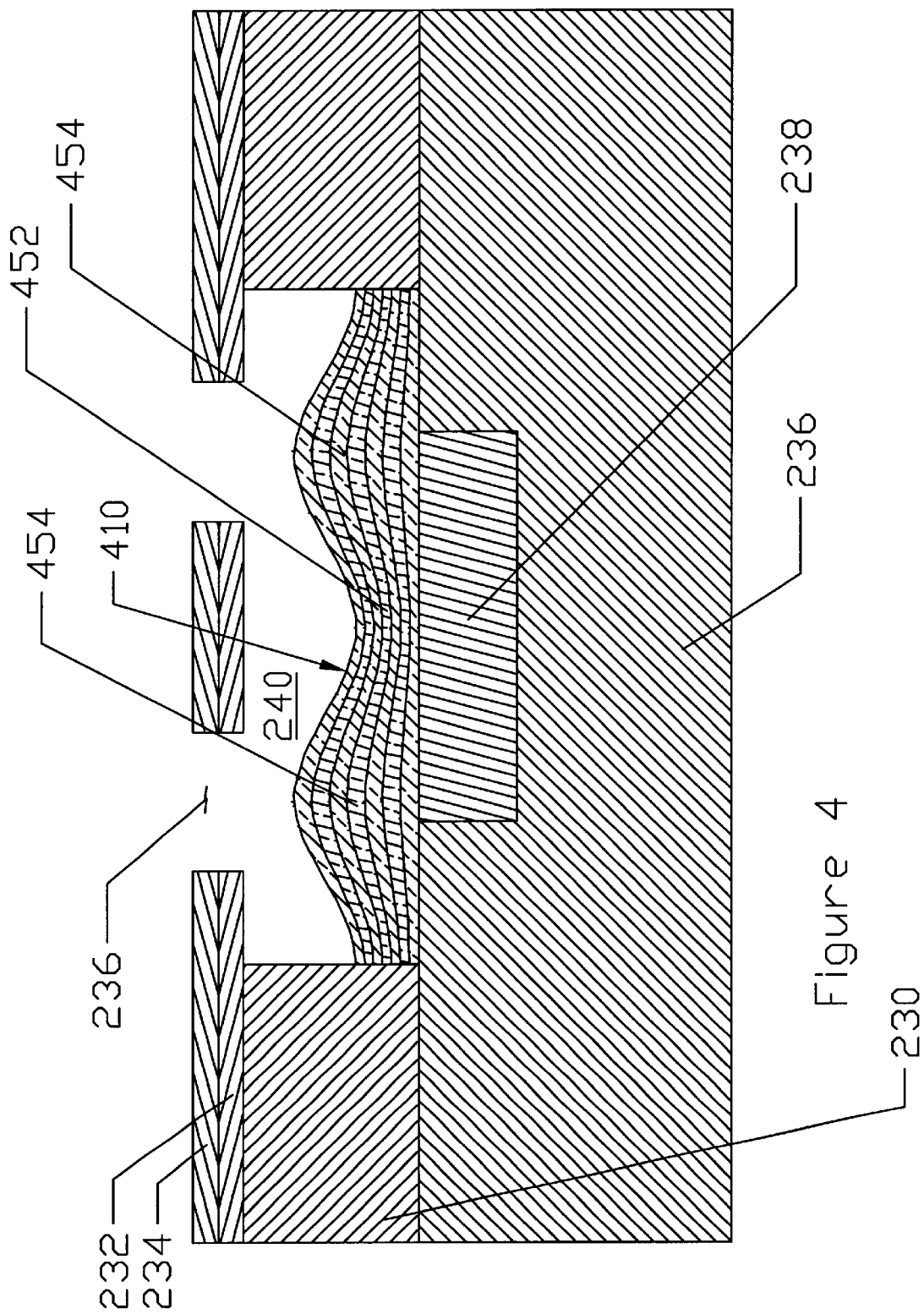

US 6,606,199 B2

GRADED THICKNESS OPTICAL ELEMENT AND METHOD OF MANUFACTURE THEREFOR

This invention was made with United States Government support under 70NAHB8H4023 awarded by NIST. The United States Government has certain rights in the invention.

BACKGROUND OF THE INVENTION

This invention relates to the field of optical elements and devices, and more particularly to graded thickness optical elements.

Conventional optical elements and devices have found widespread use in modern technology for producing, receiving and/or controlling light, for example, in communication systems, laser printers, compact disk players, and so on. For many such applications, a light source such as a semiconductor laser or LED is coupled to a semiconductor receiver (e.g. photodiode) through a fiber optic link, free space, or off a reflective surface.

In some cases, micro mirrors are used to direct light as desired, such as in wavelength division multiplexing, optical filtering, as well as other applications. Micro-mirrors are also commonly used to, for example, create optical cavities, such as Fabry-Perot cavities, for Vertical Cavity Surface Emitting Lasers (VCSEL), Resonant Cavity Photo Detectors (RCPD), and other devices. A limitation of many conventional micro-mirrors is that the reflectance provided by the micro-mirror is uniform across the optical path or cavity. When applied to VCSEL and RCPD devices, for example, such uniform lateral reflectance can favor multi-mode operation. For many applications, however, a single lowest-order mode of operation is desirable. A single lowest-order mode can help couple the light into single-mode fibers, and may also be desirable for free-space and/or wavelength sensitive systems.

Micro-lenses have also found widespread use in many of today's systems. Micro-lenses are often used for focusing, directing, and/or controlling light in a wide variety of optical applications. For example, micro-lenses can be used to help align optical fibers, such as single mode optical fibers, with other electro-optical elements, such as LEDs, VCSELs, RCPDs, etc. Micro-lenses can also be used in printer, compact disk player, and other applications to considerable advantage.

SUMMARY OF THE INVENTION

The present invention provides a graded thickness optical element for use in a wide variety of applications, including those mentioned above and many others. It is contemplated that the graded thickness optical element of the present invention may function as a mirror, a lens or both, depending on the application. In a preferred embodiment, the graded thickness optical element includes one or more layers, each having a thickness that is graded laterally across the optical element. For micro-lens applications, the refractive index of selected layers may be substantially the same. For micromirror applications, the refractive index of selected layers may be different from adjacent layers. Methods for forming the graded thickness optical element are also contemplated. In a preferred embodiment, the graded thickness optical element is formed by depositing one or more layers of the optical element through an aperture that is spaced above a receiving substrate, wherein the deposited graded thickness optical element extends laterally beyond the aperture, in at least one region.

BRIEF DESCRIPTION OF DRAWINGS

FIGS. 2A–2H are schematic diagrams showing an illustrative method of manufacture a graded thickness optical element in accordance with the present invention;

FIG. 4 is a cross-sectional side view of an illustrative graded thickness optical element at an advanced stage of manufacture in accordance with the present invention.

DETAILED DESCRIPTION OF THE INVENTION

Figure 1:
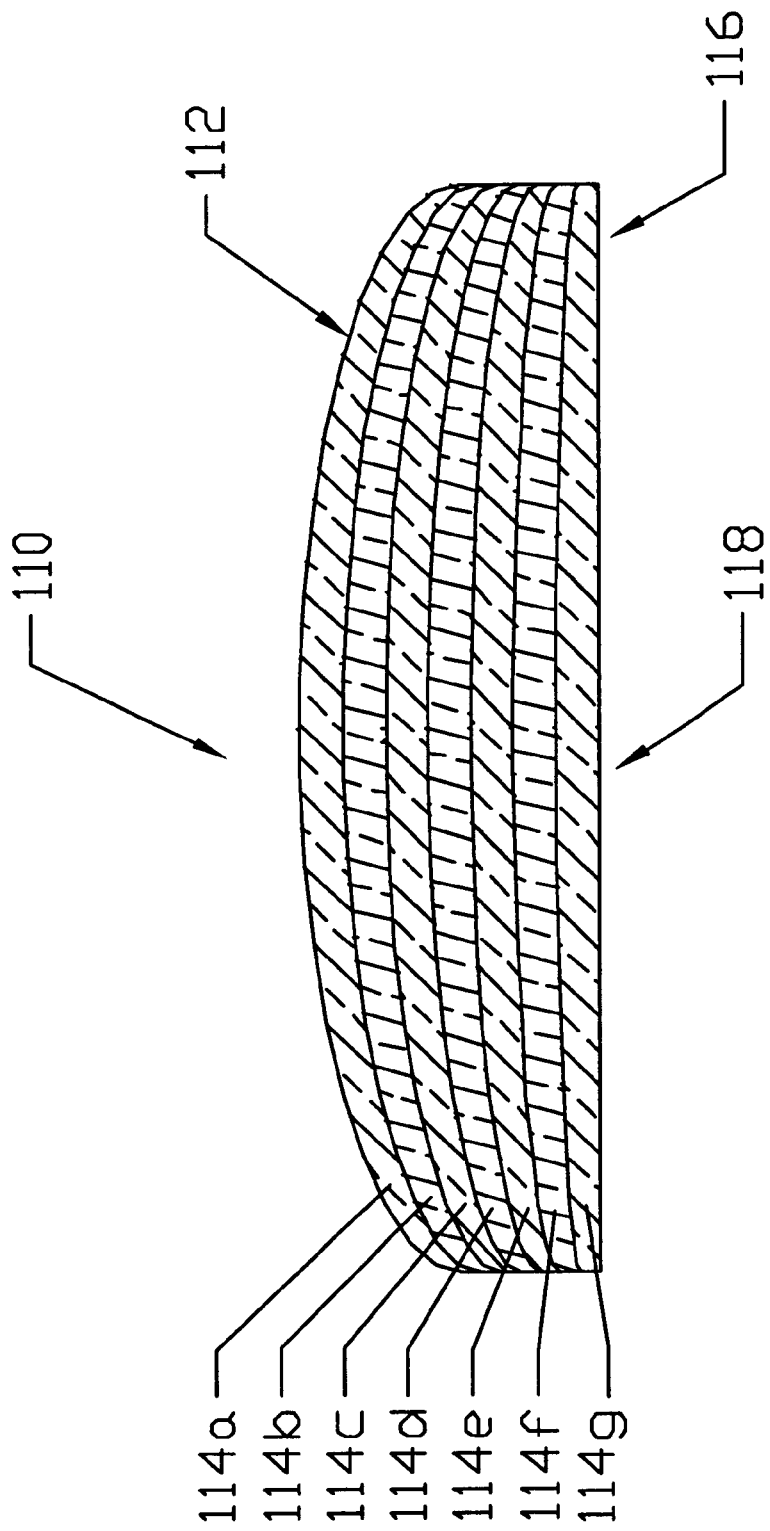
FIG. 1 is a cross-sectional side view of an illustrative graded thickness optical element in accordance with the present invention.

The following description should be read with reference to the drawings wherein like reference numerals indicate like elements throughout the several drawings. The detailed description and drawings are only illustrative of the present invention, and are not intended to be limiting.

FIG. 1 is a cross-sectional side view of an illustrative graded thickness optical element 110 in accordance with the present invention. Optical element 110 includes an optical layer stack generally shown at 112. Optical layer stack 112 includes individual layers 114a–g. Layers 114a–g each having an edge region generally shown at 116, and a center region generally shown at 118. Preferably, at least some of the individual layers 114a–g are thicker in the center region 118 than in the edge region 116, and have a generally curved upper surface, as shown. Optical layer stack 112 may be generally circular, if desired, but this is not required.

Preferably, each individual layer 114 is made of an optical material such as a dielectric or semiconductor material having an index of refraction and that is at least partially transparent at the desired wavelength range. In the illustrative embodiment, layers 114a–114g have alternating indexes of refraction. For example layers 114a, 114c, 114e and 114g may have a first index of refraction, and layers 114b, 114d, and 114f have a second index of refraction. Such a configuration may be particularly suitable for forming a micromirror, as described above. However, it is contemplated that a micro-lens may be easily formed by providing layers 14a–14g with the same or similar indexes of refraction. Preferably, when forming a micro-lens, one or just a few layers 114 are provided, to reduce any reflections at the interface of the layers 114.

Figure 2B:
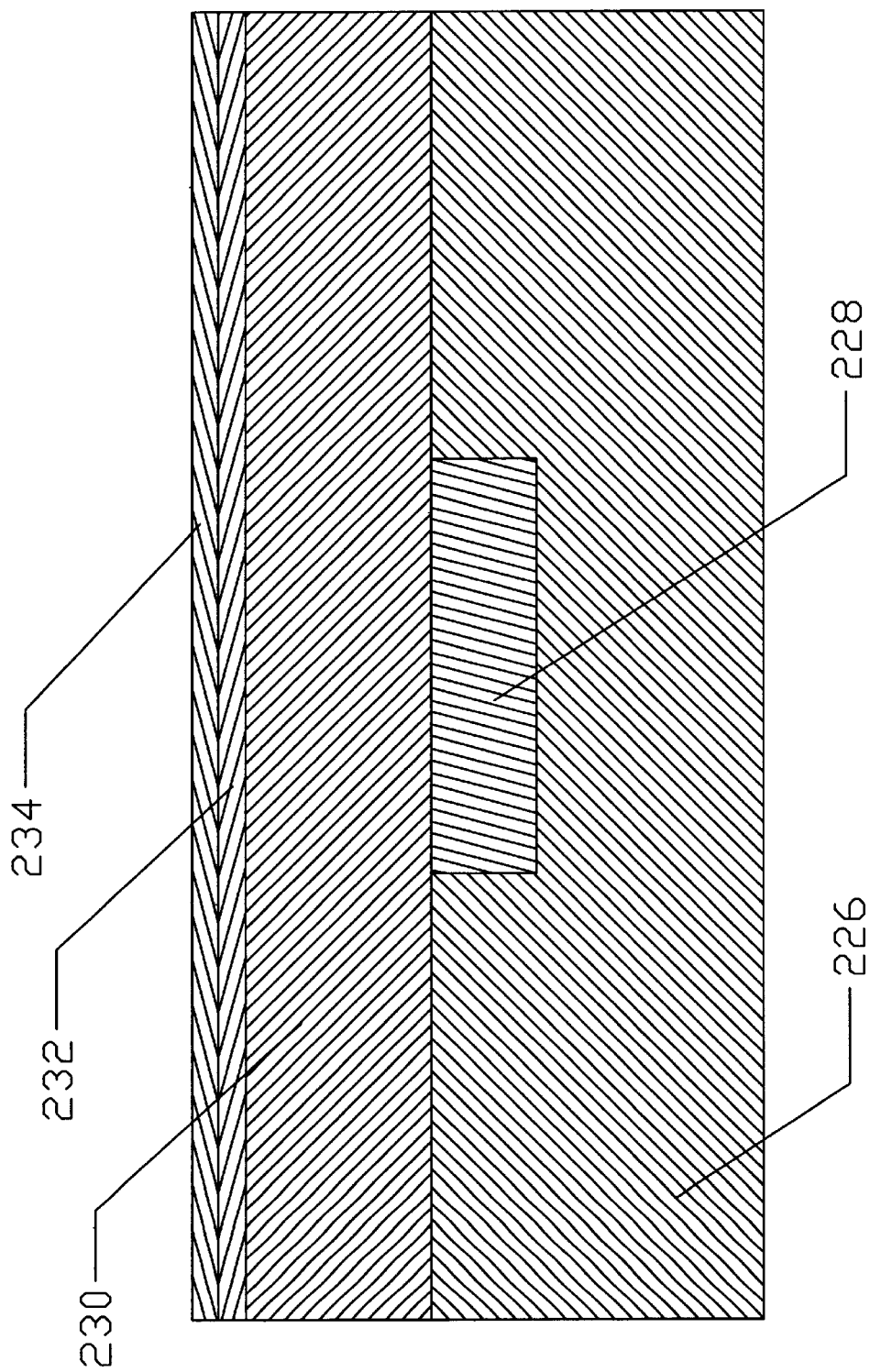

FIGS. 2A through 2H are schematic diagrams showing an illustrative method for forming a graded thickness optical element, such as optical element 110 of FIG. 1. Referring first to FIG. 2A, a substrate 226 is shown with an optical device 228 such as a VCSEL, RCPD, LED or other optical device formed therein. Optical device 228 is optional, and the desirability of providing the optical device 228 will depend on the application at hand.

In the illustrative embodiment, and referring now to FIG. 2B, a spacer layer 230 may be provided as a spacer. Spacer layer 230 may be made from any suitable material that is susceptible to an isotropic etching process. It is contemplated that spacer layer 230 may be made from several different layers, if desired. In a preferred embodiment, spacer layer 230 is a polymer such as polyimide, which is deposited by spin coating on substrate 226. Once layer 230 is provided, a masking layer 232 may be provided. As described more fully below, masking layer 232 can be used as a mask when depositing the one or more layers 114a–g of the graded thickness optical element 110. In a preferred embodiment, masking layer 232 is silicon dioxide deposited by plasma enhanced chemical vapor deposition (PECVD). It is contemplated, however, that masking layer 232 may be made from any material that is resistant to the etching process used to etch spacer layer 230, as further described below. It is also contemplated that the masking layer 232 may be provided by any thin film epitaxy process such as e-beam, thermal, and/or sputter coating.

Figure 2D:
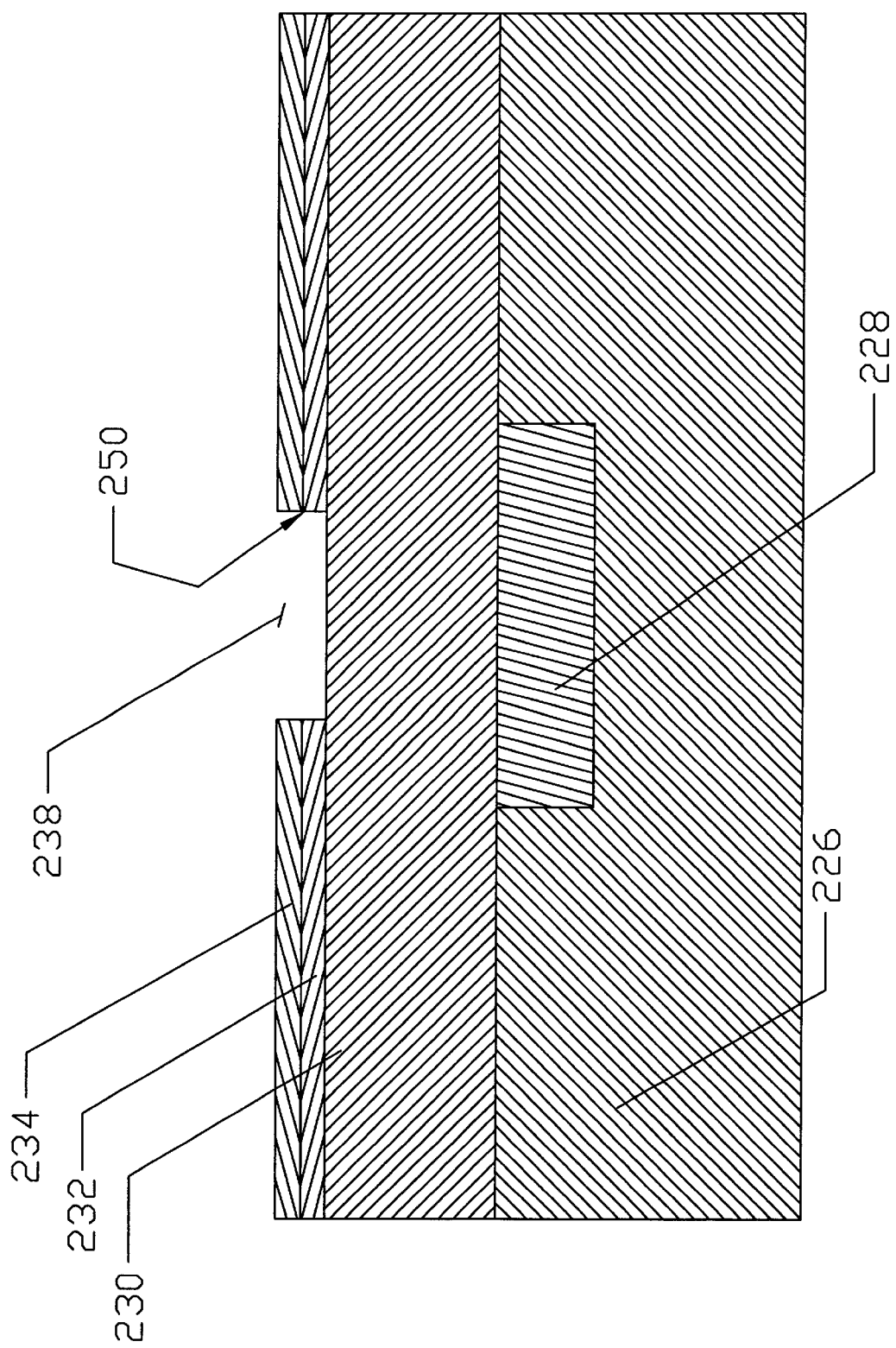

Next, a photo-resist layer 234 is preferably provided over masking layer 232, preferably using spin coating. Photo-resist layer 234 is then patterned using conventional patterning techniques such as photolithography to create an aperture 236 therein, as shown in FIG. 2C. Once the aperture 236 is formed in the photo-resist layer 234, masking layer 232 is etched preferably using a selective etch to produce aperture 238 therein as shown in FIG. 2D. Aperture 238 preferably has a substantially vertical lateral edge 250, as shown.

Once aperture 238 is formed in masking layer 232, intermediate spacer layer 230 is etched through aperture 238, preferably using a selective reactive ion etch (RIE) to create an aperture 240 having a lateral edge 242, as shown in FIG. 2E. Aperture 240 is preferably etched using an isotropic selective etch so that lateral edge 242 of aperture 240 extends laterally beyond the lateral edge 250 in the masking layer 232 in at least one direction, but preferably in all directions.

Figure 2F:
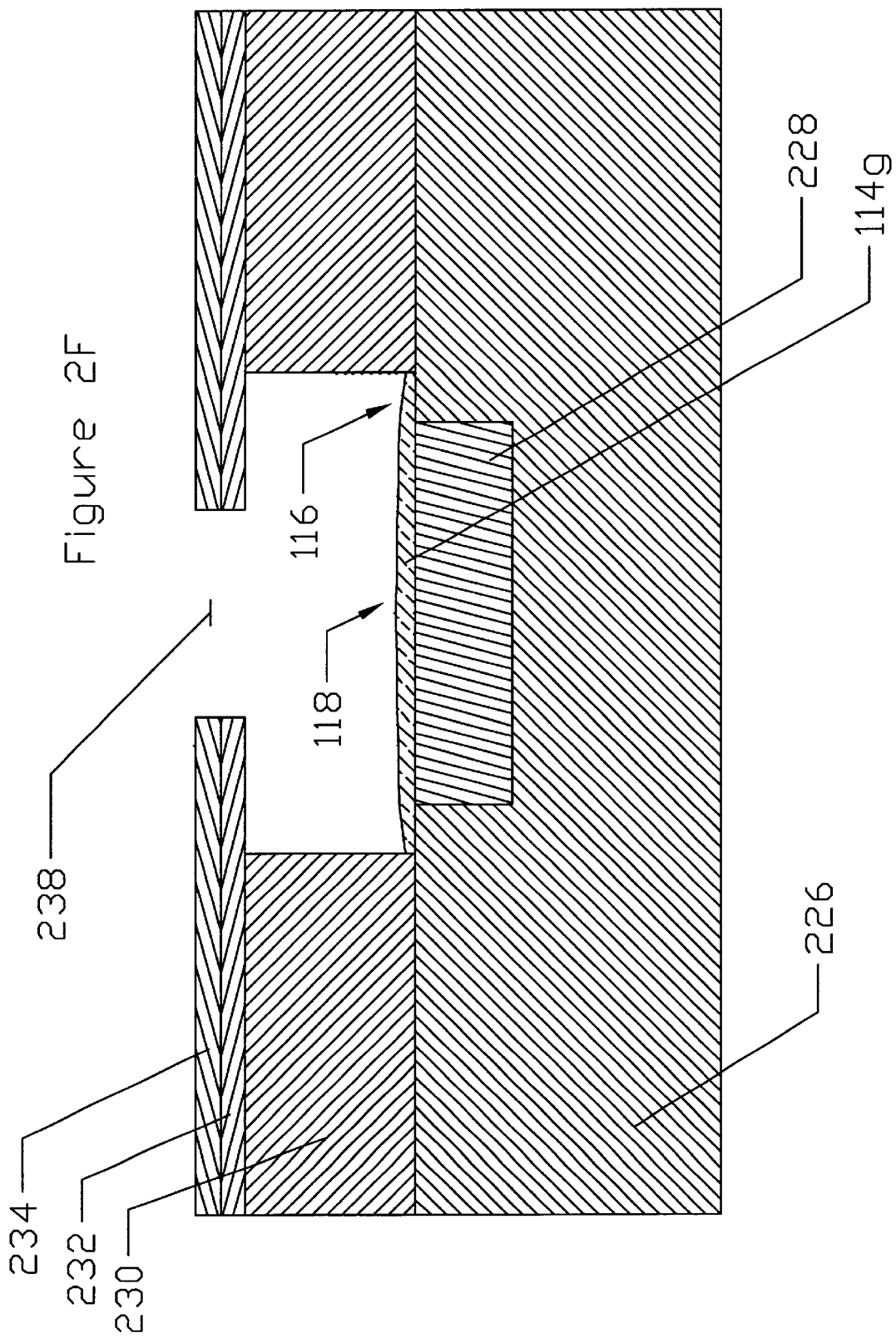

A graded thickness optical element 110 (see FIG. 1) may then be deposited through the aperture 238 in the masking layer 232. In the illustrative embodiment, layers 114a–114g are sequentially deposited through aperture 238. For example, a first material having a first index of refraction may be deposited through aperture 238 to produce a first layer 114g of optical layer stack 112, as shown in FIG. 2F. The deposition is preferably an optical quality vacuum deposition process, or other suitable process as desired. Since masking layer 232 and aperture 238 are spaced from the surface of the substrate 226, more material tends to be deposited in center region 118 than in edge region 116, resulting in the center region 118 being thicker than the edge region 116. Also, the top surface of each deposited layer tends to be curved, as shown.

Figure 2G:
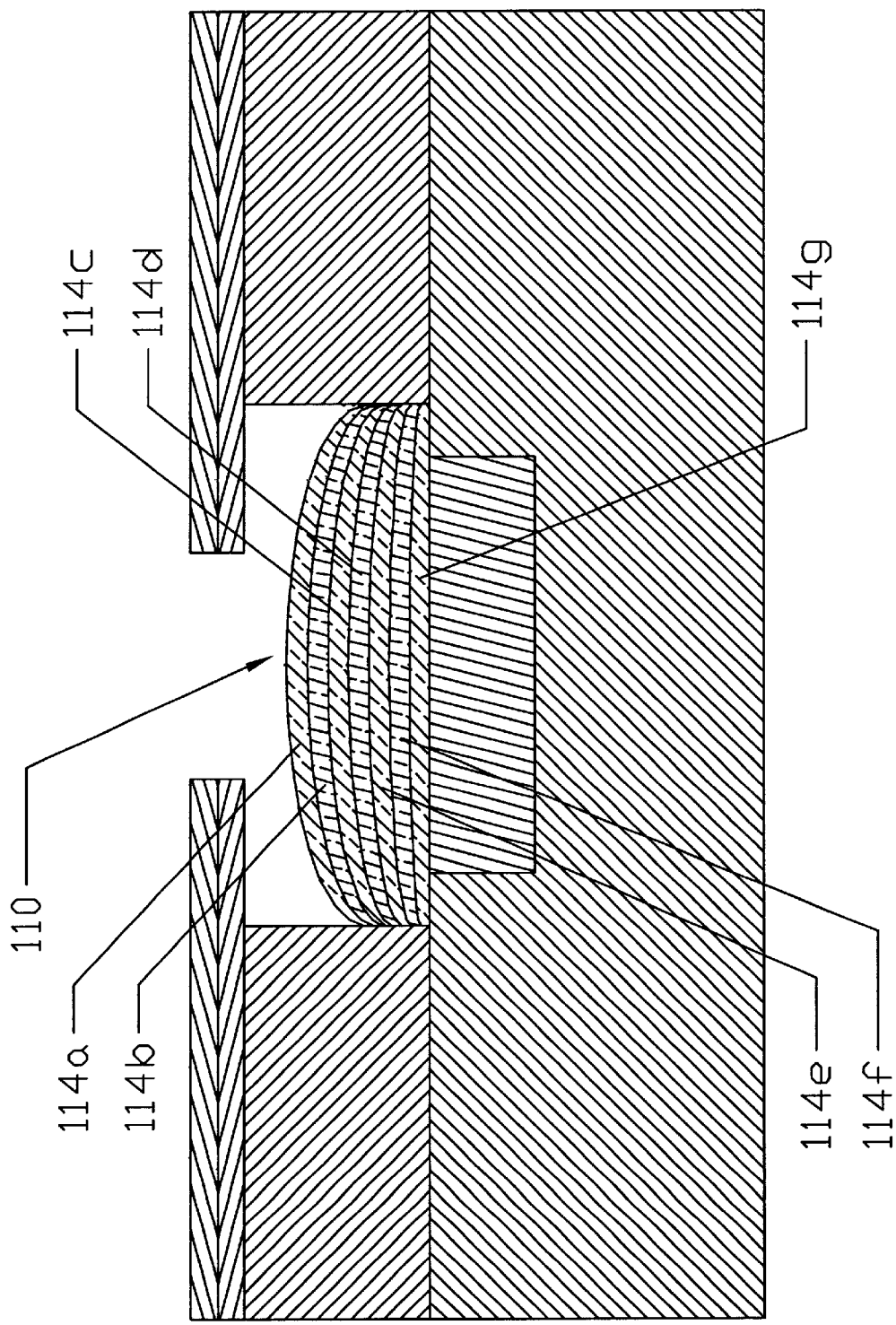

Once first layer 114g is provided, a second layer 114f is deposited through aperture 238. This second layer 114f may be of the same refractive material as the first layer 114g, or a different refractive material that has a different index of refraction. Like the first layer 114g, the second layer 114f is preferably an optical quality glass, polymer, semiconductor and/or dielectric such as GaAs, AlGaAs, $SiO_2$, $Si_3N_4$, $TiO_2$ or other suitable material. Additional layers 114e–114a may also be deposited, if desired, to form an optical layer stack as shown in FIG. 2G.

Figure 2H:
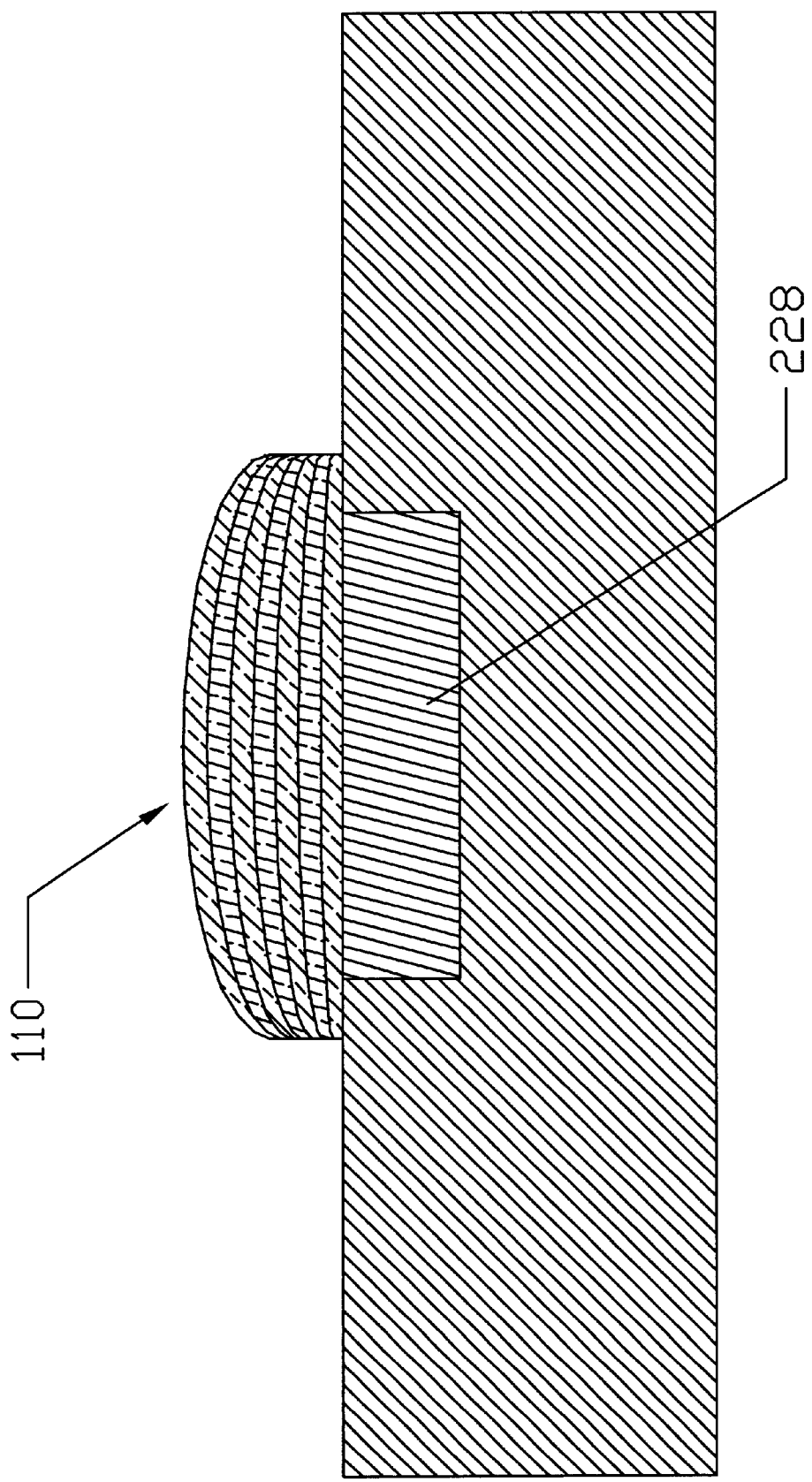

The shape of optical element 110 may be controlled by several parameters. Some of these parameters include the shape and size of aperture 240 in spacer layer 230, the thickness of spacer layer 230, the shape, size and position of aperture 238 in spacer layer 230 relative to aperture 238 in masking layer 232, and the thickness of lateral edge 250 of aperture 238. Other parameters include the refractive material deposition method, the material used, and the amount of material deposited. These parameters may be adjusted to alter the shape and characteristics of optical element 110, depending on the particular application. In some embodiments, layers 230, 232 and 234 may be removed, as shown in FIG. 2H, to expose the optical element 110.

When forming micro-mirrors, layers 114a–114g may be relatively thin, and the indexes of refraction may alternate between adjacent layers. When forming a micro-lens, one or more thicker layers may be provided, with each layer having the same or similar refractive index.

If substrate 226 includes one or more optical elements as shown, such as optical element 228, at least a portion of layer 114g may be in contact with the optical element 228. Alternatively a spacer or buffer layer (not shown) may be provided between the optical element 228 and layer 114g. In addition, it is contemplated that layer 114g may be centered on optical element 228, as is shown in FIG. 2F, or laterally offset from optical element 228, depending on the application.

It is contemplated that optical element 110 may be part of, or assist in the operation of, optical device 228. For example, optical device 228 may be a Vertical Cavity Surface Emitting Laser (VCSEL), and optical element 110 may function as all or part of the top mirror of the VCSEL. As is known, VCSEL devices typically have a lasing cavity defined by two reflective mirrors, such as Distributed Bragg reflectors including semiconductor and/or dielectric mirror stacks. The graded thickness optical element 110 of the present invention may help create a top mirror with a reflectivity that varies laterally across the optical cavity of the VCSEL. To reduce the number of modes of the VCSEL, the reflectivity of the top mirror preferably decreases towards the lateral edges of optical cavity. Thus, when properly configured, the present invention may be used to help provide mode control of VCSEL devices. Such mode control can be similarly applied to RCPDs, if desired.

Figure 3:
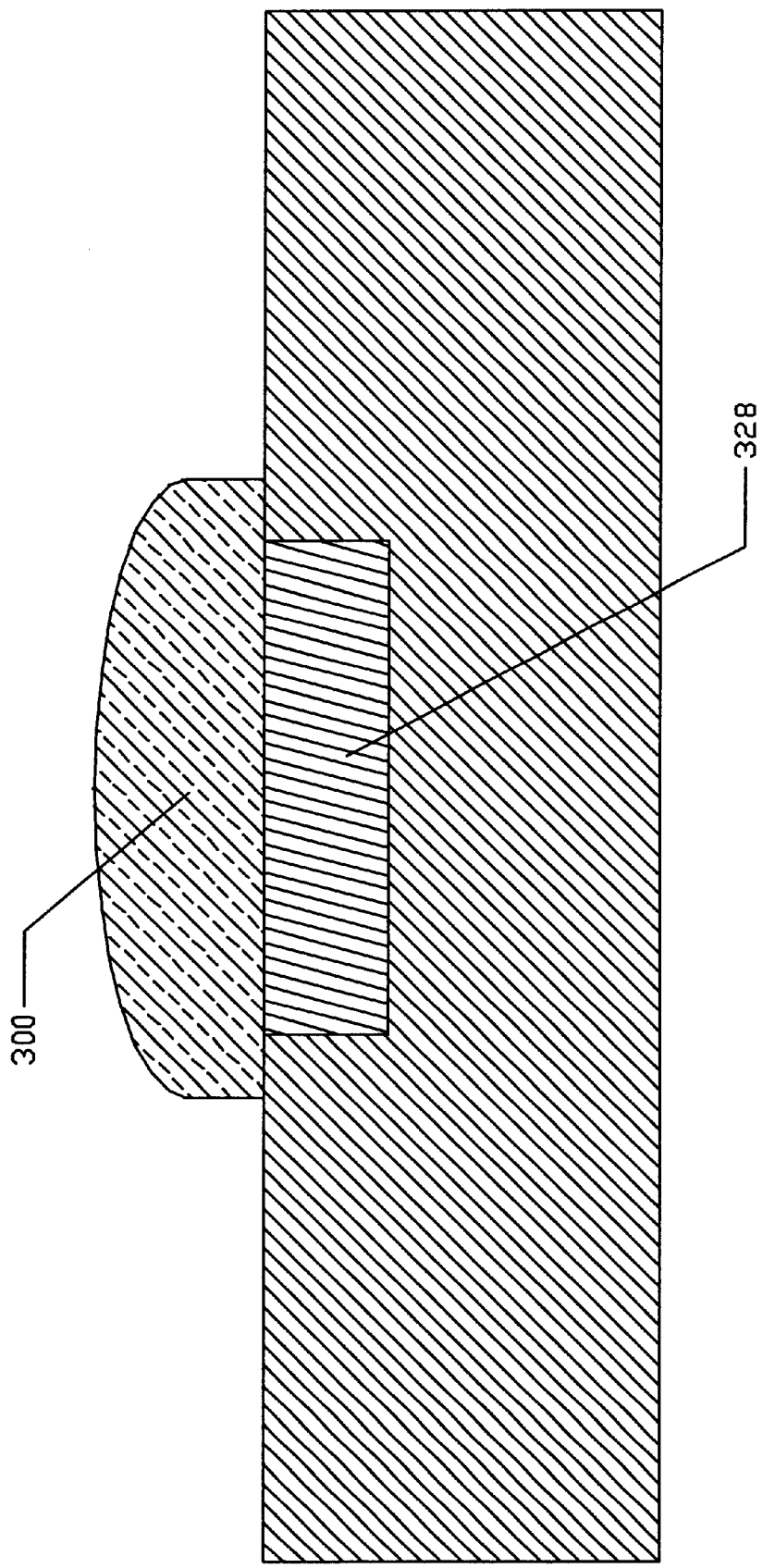
FIG. 3 is a cross-sectional side view of an illustrative graded thickness optical element that is used in conjunction with an electro-optical device.

Alternatively, and as shown in FIG. 3, the optical element 300 may function as a micro-lens. Preferably, the optical element 300 includes a single or a relatively small number of thicker layers, each having a graded thickness. When optical device 328 is a light emitting or light receiving device, such as a light emitting diode (LED), a VCSEL, a photo-diode, RCPD or other light emitting or receiving device, the optical element 300 may, for example, increase the angle of visibility of the light, focus the light, direct the light in a particular direction, etc. Optical device 328 is optional, and need not be provided in the substrate as shown.

The optical element may have a plano-concave region as shown in FIG. 4. The steps to create an optical element 410 having a curved upper surface with a concave region 452 are substantially the same as those used to create optical element 110 as described above. Aperture 236 photo-etched in layer 234 is shaped such that a portion of layer 234 is surrounded on at three side by aperture 236. Thus, when the isotropic etching process is used to etch aperture 240 in layer 230, a part of layers 234 and 232 projects over aperture 240, connected to the other parts of layers 234 and 232 by a neck. There may also be a plurality of apertures 236, located proximate to each other such that one aperture 240 is formed during the isotropic etching process. When material is deposited through aperture 236, less material will tend to get deposited in regions that are under layers 234 and 232 than in regions that are under aperture 236. Thus, a concave region 452 surrounded by convex regions 454 of element 410 will be formed. In a preferred embodiment, layers 230, 232 and 234 are removed to expose the optical element.

If substrate 226 includes an optical device 228, optical element 410 may assist in the operation of the device. Concave region 452 may be used to focus or direct light from an LED or VCSL. Concave region 452 may also be used as part of an unstable resonant cavity that preferentially favors high power single mode emission While the invention is susceptible to various modifications, and alternative forms, specific examples thereof have been shown in the drawings and are herein described in detail. It should be understood, however, that the invention is not to be limited to the particular forms or methods disclosed, but to the contrary, the invention is to cover all modifications, equivalents and alternatives falling within the spirit and scope of the appended claims.

What is claimed is:

1. A method of making a graded thickness optical element, the method comprising the steps of:
   providing a first layer having an aperture spaced above a substrate;
   providing one or more materials on the substrate through the aperture in the first layer to form a graded thickness optical element that extends laterally beyond the aperture in at least one region; and
   providing an intermediate layer between the first layer and the substrate wherein the intermediate layer has an aperture that extends laterally beyond the aperture in the first layer in at least one region; and
   wherein the steps of providing the first layer and the intermediate layer include the steps of:
      applying the intermediate layer adjacent the substrate;
      applying the first layer adjacent the intermediate layer;
      applying a third layer adjacent the first layer;
      creating an aperture in the third layer;
      creating an aperture in the first layer; and
      creating an aperture in the intermediate layer, wherein the aperture in the intermediate layer extends laterally beyond the aperture in the first layer in the at least one region.

2. The method of claim 1, wherein the third layer is a photo-resist layer, and the aperture in the third layer is created using photolithography.

3. The method of claim 1, wherein the aperture in the first layer is created using an etching process.

4. The method of claim 1, wherein the aperture in the intermediate layer is created using an isotropic etching process.

5. A method of making a graded thickness optical element, the method comprising the steps of:
   providing a first layer having an aperture spaced above a substrate;
   providing one or more materials on the substrate through the aperture in the first layer to form a graded thickness optical element that extends laterally beyond the aperture in at least one region; and
   providing an intermediate layer between the first layer and the substrate wherein the intermediate layer has an aperture that extends laterally beyond the aperture in the first layer in at least one region, wherein the intermediate layer is a polymer.

6. The method of claim 5, wherein the polymer is polyimide.

7. A method of making a graded thickness optical element, the method comprising the steps of:
   providing a first layer having an aperture spaced above a substrate; and
   providing one or more materials on the substrate through the aperture in the first layer to form a graded thickness optical element that extends laterally beyond the aperture in at least one region; and
   wherein:
      the substrate includes an optical device under the optical layer;
      the optical device is a light detector;
      the light detector is a Resonant Cavity Photo Detector; and
      the graded thickness optical element is a mirror that at least contributes to the reflectance of a top mirror of the Resonant Cavity Photo Detector.

8. The method of claim 7 wherein the reflectance of the graded thickness optical element changes across the graded thickness optical element.

9. The method of claim 8 wherein the reflectance of the graded thickness optical element decreases toward the lateral edges of the graded thickness optical element.

10. A method of making a graded thickness optical element, the method comprising the steps of:
    providing a first layer having an aperture spaced above a substrate; and
    providing one or more materials on the substrate through the aperture in the first layer to form a graded thickness optical element that extends laterally beyond the aperture in at least one region; and
    wherein the step of providing one or more materials to the substrate through the aperture in the first layer to form a graded thickness optical layer comprises the steps of:
       depositing a first layer of refractive material having a first index of refraction; and
       depositing a second layer of refractive material having a second index of refraction.

11. A method of making a graded thickness optical element, the method comprising the steps of:
    providing a first layer having an aperture spaced above a substrate; and
    providing one or more materials on the substrate through the aperture in the first layer to form a graded thickness optical element that extends laterally beyond the aperture in at least one region; and
    wherein the step of providing one or more materials to the substrate through the aperture in the first layer to form a graded thickness optical layer comprises the steps of alternately depositing a layer of refractive material having a first index of refraction and depositing a layer of refractive material having a second index of refraction.

12. The method of claim 11, wherein the first index of refraction is different from the second index of refraction.

13. A method of making a graded thickness optical element, the method comprising the steps of:
    providing a first layer having an aperture spaced above a substrate;
    providing one or more materials on the substrate through the aperture in the first layer to form a graded thickness optical element that extends laterally beyond the aperture in at least one region; and
    providing an intermediate layer between the first layer and the substrate wherein the intermediate layer has an aperture that extends laterally beyond the aperture in the first layer in at least one region; and
    wherein the first layer is a dielectric material.

14. A method of making a graded thickness optical element, the method comprising the steps of:
    providing a first layer having an aperture spaced above a substrate; and providing one or more materials on the substrate through the aperture in the first layer to form a graded thickness optical element that extends laterally beyond the aperture in at least one region; and wherein:

the substrate includes an optical device under the optical layer;

the optical device is a light detector; and the light detector is a Resonant Cavity Photo Detector.

15. An optical element comprising:

a plurality of refractive layers, each layer having a center region, an edge region and an index of refraction; and wherein:

the center region of each layer is thicker than the edge region and selected layers have different indexes of refraction; and at least one of the layers includes a dielectric material.

* * * * *